(12) United States Patent
Skrocki et al.

(10) Patent No.: US 11,700,439 B2
(45) Date of Patent: Jul. 11, 2023

(54) VEHICULAR CAMERA ASSEMBLY PROCESS USING HEAT STAKING DURING ACTIVE FOCUS AND ALIGNMENT TO SECURE LENS RELATIVE TO IMAGER

(71) Applicant: Magna Electronics Inc., Auburn Hills, MI (US)

(72) Inventors: Gavin E. Skrocki, Bay City, MI (US); Robert A. Devota, Durand, MI (US); Matthew C. Sesti, Williamston, MI (US); Donald W. Mersino, Montrose, MI (US)

(73) Assignee: Magna Electronics Inc., Auburn Hills, MI (US)

( * ) Notice: Subject to any disclaimer, the term of this patent is extended or adjusted under 35 U.S.C. 154(b) by 71 days.

(21) Appl. No.: 17/448,534

(22) Filed: Sep. 23, 2021

(65) Prior Publication Data

US 2022/0103723 A1 Mar. 31, 2022

Related U.S. Application Data (60) Provisional application No. 63/198,034, filed on Sep. 25, 2020.

(51) Int. Cl.
| | |
|---|---|
| *B60R 11/04* | (2006.01) |
| *H04N 23/54* | (2023.01) |
| *H05K 1/18* | (2006.01) |
| *H04N 23/57* | (2023.01) |

(52) U.S. Cl.
CPC ............ *H04N 23/54* (2023.01); *B60R 11/04* (2013.01); *H04N 23/57* (2023.01); *H05K 1/181* (2013.01); *B60R 2300/105* (2013.01); *H05K 2201/10151* (2013.01)

(58) Field of Classification Search
USPC ........................................................ 348/148
See application file for complete search history.

(56) References Cited

U.S. PATENT DOCUMENTS

| | | | |
|---|---|---|---|
| 5,550,677 | A | 8/1996 | Schofield et al. |
| 5,670,935 | A | 9/1997 | Schofield et al. |
| 5,949,331 | A | 9/1999 | Schofield et al. |
| 7,965,336 | B2 | 6/2011 | Bingle et al. |
| 8,542,451 | B2 | 9/2013 | Lu et al. |
| 9,233,641 | B2 | 1/2016 | Sesti et al. |
| 9,277,104 | B2 | 3/2016 | Sesti et al. |
| 9,451,138 | B2 | 9/2016 | Winden et al. |
| 9,596,387 | B2 | 3/2017 | Achenbach et al. |

(Continued)

*Primary Examiner* — Behrooz M Senfi
(74) *Attorney, Agent, or Firm* — Honigman LLP (57) ABSTRACT

A vehicular camera includes a lens holder accommodating a lens and an imager printed circuit board (imager PCB). The lens holder includes a plurality of posts protruding from an attaching portion of the lens holder. The imager PCB includes an imager disposed at a first side of the imager PCB, and includes a plurality of apertures therethrough. The attaching portion of the lens holder is positioned at the imager PCB such that the posts protrude through the apertures of the imager PCB. The posts are movable within the apertures while the lens is adjusted relative to the imager to align the lens relative to the imager. With the lens aligned relative to the imager, the posts are heated to deform within the apertures, whereby the deformed posts harden upon cooling to secure the lens holder relative to the imager PCB.

24 Claims, 5 Drawing Sheets

(56) References Cited

U.S. PATENT DOCUMENTS

| | | |
|---|---|---|
| 9,871,971 B2 | 1/2018 | Wang et al. |
| 9,896,039 B2 | 2/2018 | Achenbach et al. |
| 10,264,219 B2 | 4/2019 | Mleczko et al. |
| 10,272,857 B2 | 4/2019 | Conger et al. |
| 10,652,437 B2 | 5/2020 | Becker et al. |
| 2013/0242099 A1* | 9/2013 | Sauer .................. B60R 1/12 348/148 |
| 2014/0373345 A1 | 12/2014 | Steigerwald |
| 2015/0222795 A1 | 8/2015 | Sauer et al. |
| 2015/0266430 A1 | 9/2015 | Mleczko et al. |
| 2015/0365569 A1 | 12/2015 | Mai et al. |
| 2016/0037028 A1 | 2/2016 | Biemer |
| 2016/0268716 A1 | 9/2016 | Conger et al. |
| 2017/0133811 A1 | 5/2017 | Conger et al. |
| 2017/0295306 A1 | 10/2017 | Mleczko |
| 2017/0302829 A1 | 10/2017 | Mleczko et al. |
| 2018/0027151 A1* | 1/2018 | Kazama .................. H04N 23/51 348/373 |
| 2018/0072239 A1 | 3/2018 | Wienecke et al. |
| 2020/0010024 A1 | 1/2020 | Sesti et al. |
| 2021/0382375 A1 | 12/2021 | Sesti et al. |
| 2022/0132007 A1 | 4/2022 | Lu |
| 2022/0373762 A1 | 11/2022 | Skrocki |

* cited by examiner

VEHICULAR CAMERA ASSEMBLY PROCESS USING HEAT STAKING DURING ACTIVE FOCUS AND ALIGNMENT TO SECURE LENS RELATIVE TO IMAGER

CROSS REFERENCE TO RELATED APPLICATION

The present application claims the filing benefits of U.S. provisional application Ser. No. 63/198,034, filed Sep. 25, 2020, which is hereby incorporated herein by reference in its entirety.

FIELD OF THE INVENTION

The present invention relates generally to a vehicle vision system for a vehicle and, more particularly, to a vehicle vision system that utilizes one or more cameras at a vehicle.

BACKGROUND OF THE INVENTION

Use of imaging sensors in vehicle imaging systems is common and known. Examples of such known systems are described in U.S. Pat. Nos. 10,652,437; 7,965,336; 5,949,331; 5,670,935 and/or 5,550,677, which are hereby incorporated herein by reference in their entireties.

SUMMARY OF THE INVENTION

The present invention provides a driver assistance system or vision system or imaging system for a vehicle that utilizes one or more cameras to capture image data representative of images exterior of the vehicle. The camera includes a lens holder and an imager printed circuit board, with the lens holder accommodating a lens or lens assembly therein. The imager printed circuit board (with the imager disposed thereat) is positioned at the lens holder with stakes or posts of the lens holder received through oversized holes or apertures of the printed circuit board (holes that allow for movement of the board relative to the posts). The lens is aligned relative to the imager (by moving the lens holder relative to the imager printed circuit board and by moving the posts within the holes) and the stakes or posts are heated to melt or deform so as to retain the circuit board in position relative to the lens when the stakes cool and re-solidify or harden. Before the stakes are heated to deform (or after heating but before they re-solidify and harden), the lens holder may be axially adjusted and/or radially adjusted and/or tilted to adjust the focus and optical alignment of the lens relative to the imager.

These and other objects, advantages, purposes and features of the present invention will become apparent upon review of the following specification in conjunction with the drawings.

DESCRIPTION OF THE PREFERRED EMBODIMENTS

A vehicle vision system and/or driver assist system and/or object detection system and/or alert system operates to capture images exterior of the vehicle and may process the captured image data to detect objects at or near the vehicle and in the predicted path of the vehicle. For example, a forward viewing camera disposed at and behind the windshield of the vehicle may capture image data of the scene forward of the vehicle for one or more driving assist systems of the vehicle. Optionally, one or more other cameras may be disposed at the vehicle with exterior fields of view, whereby the image data captured by those cameras may be processed for object detection and/or used to generate video images for viewing by the driver of the vehicle, such as to assist a driver of the vehicle in maneuvering the vehicle in a rearward direction. The vision system includes an image processor or image processing system that is operable to receive image data from one or more cameras and provide an output to a vehicle system and/or to a display device for displaying images representative of the captured image data. Optionally, the vision system may provide display, such as a rearview display or a top down or bird's eye or surround view display or the like.

Figure 1:
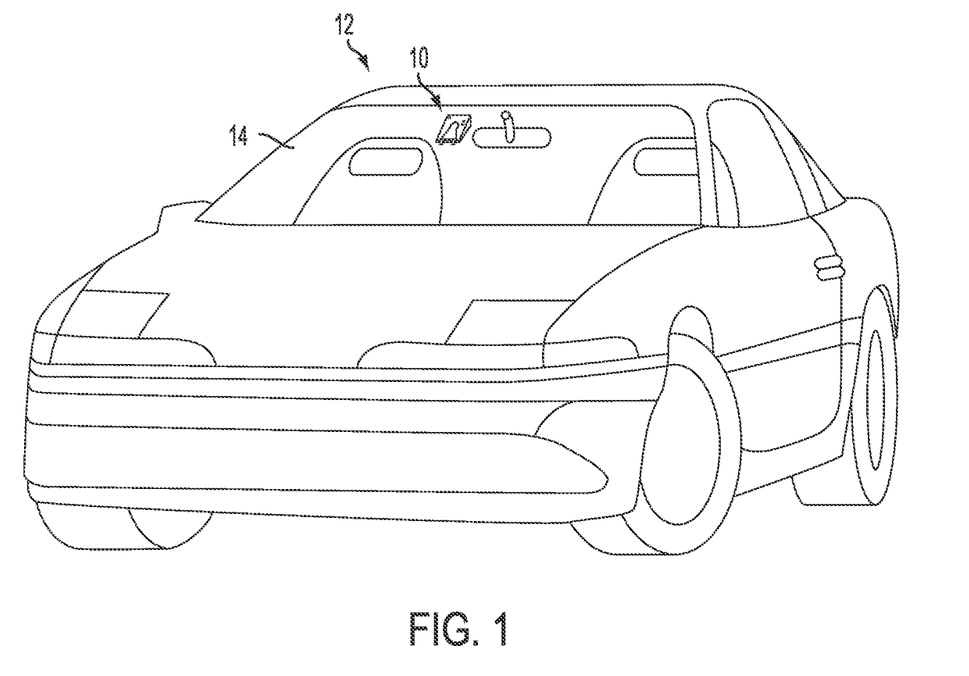
FIG. 1 is a perspective view of a vehicle with a vision system that incorporates a camera in accordance with the present invention.

Referring now to the drawings and the illustrative embodiments depicted therein, a vision system 10 for a vehicle 12 includes at least one exterior viewing imaging sensor or camera, such as a forward viewing imaging sensor or camera, which may be disposed at and behind the windshield 14 of the vehicle 12 and viewing forward through the windshield 14 so as to capture image data representative of the scene occurring forward of the vehicle (FIG. 1). Optionally, the system may include multiple exterior viewing imaging sensors or cameras, such as a forward viewing camera at the front of the vehicle, and a sideward/rearward viewing camera at respective sides of the vehicle, and a rearward viewing camera at the rear of the vehicle, which capture images exterior of the vehicle. The camera or cameras each include a lens for focusing images at or onto an imaging array or imaging plane or imager of the camera. The forward viewing camera disposed at the windshield 14 of the vehicle 12 views through the windshield 14 and forward of the vehicle 12, such as for a machine vision system (such as for traffic sign recognition, headlamp control, pedestrian detection, collision avoidance, lane marker detection and/or the like). The vision system 10 includes a control or electronic control unit (ECU) having electronic circuitry and associated software, with the electronic circuitry including a data processor or image processor that is operable to process image data captured by the camera or cameras, whereby the ECU may detect or determine presence of objects or the like and/or the system provide displayed images at a display device for viewing by the driver of the vehicle. The data transfer or signal communication from the camera to the ECU may comprise any suitable data or communication link, such as a vehicle network bus or the like of the equipped vehicle.

Typically, active focus and alignment is used to set and secure a focal position of a lens to an imager component. However, this leads to expensive and complicated measures to manage the compliance tolerances created by camera components and manufacturing focus/alignment process. For example, a camera may be assembled using an active PCB alignment, which may use screws to secure the PCB to the lens holder or front camera housing. After the PCB is secured to the lens holder, the lens barrel (such as a threaded lens barrel) is threaded into the lens holder and used to set the focus of the lens relative to the imager. After the lens and imager are optically aligned and focused (via threading the lens barrel into the lens holder), the lens barrel (and lens) is secured to the lens holder with adhesive on the lens threads.

Optionally, active lens alignment may be provided where the imager PCB is secured to the housing using screws and the lens is actively moved to set focus and alignment, whereby a quick cure adhesive is used to set the focus and alignment of the lens relative to the imager. The adhesive acts as a compliant material (before it is cured) to allow for focus and alignment, which is achieved by moving the lens relative to the lens holder. The UV and additional curing increases the tolerance stack of the finished assembly. Quick cure adhesives require UV curing and additional curing. This curing increases the tolerance stack of the finished assembly.

Optionally, active PCB focus and alignment may be achieved via a one piece lens assembly that is secured to the housing or lens holder utilizing adhesive initially, and then the imager PCB is actively moved relative to the housing or lens holder to set focus, alignment, and rotation, where a quick cure adhesive is used to set the focus, alignment, and rotation. The adhesive (that bonds the circuit board to the lens holder) acts as a compliant material (before it is cured) to allow for focus and alignment, which is achieved by moving the PCB relative to the lens holder. The UV and additional curing increases the tolerance stack of the finished assembly, and quick cure adhesives require UV+additional curing. This curing increases the tolerance stack of the finished assembly.

Figure 2:
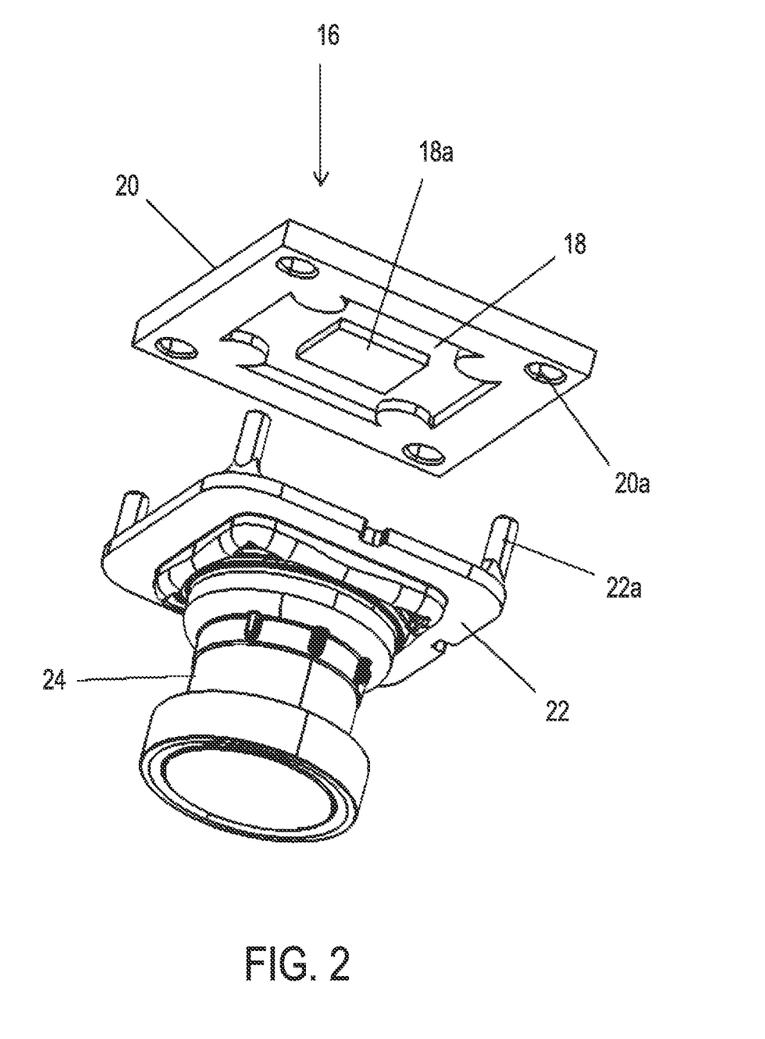
FIG. 2 is an exploded perspective view of part of the camera or imager assembly, showing the imager circuit board aligned for joining with the lens holder of the camera.
Figure 3:
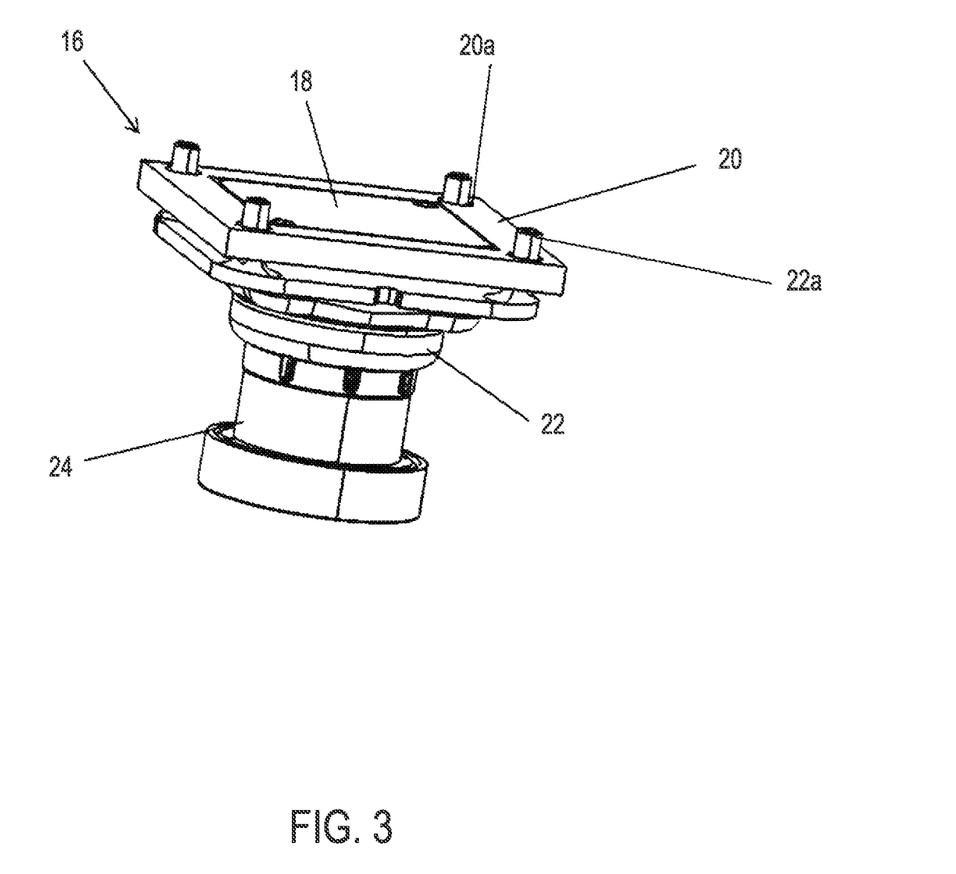
FIG. 3 is a perspective view of the part of the camera, showing the stakes or posts of the lens holder received through respective apertures of the imager circuit board.

Referring now to FIGS. 2 and 3, an alternative build assembly process utilizes non-contact heat staking to secure the lens holder relative to the imager printed circuit board (PCB) and imager during and/or after the optical alignment and focusing process that aligns and focuses the lens relative to the imager. The focus and optical alignment process allows for all degrees of freedom to be compensated for with adjusting the lens holder and lens barrel relative to the PCB for alignment and focus of the lens relative to the imager.

Figure 4:
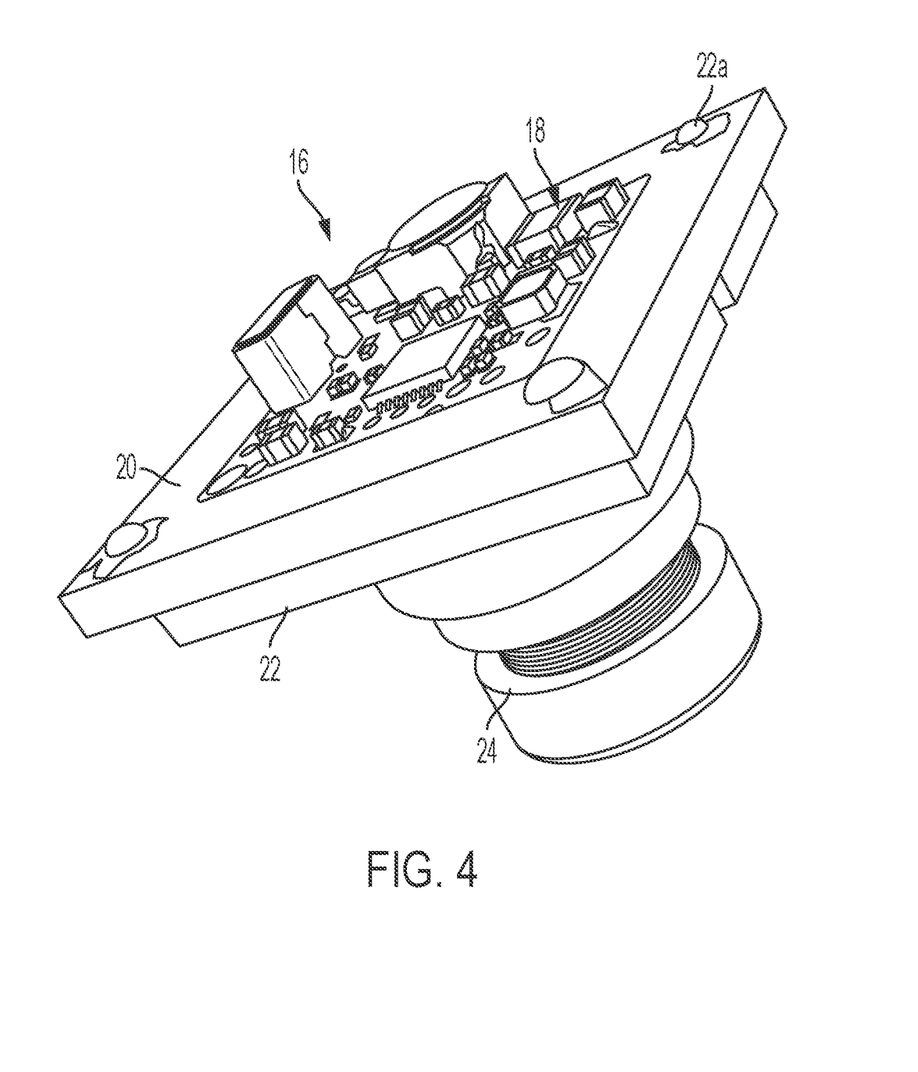
FIG. 4 is a perspective view of the part of the camera, showing the stakes in their deformed state to secure the imager circuit board relative to the lens holder.

As shown in FIG. 2, the imager assembly or camera 16 comprises an imager printed circuit board (PCB) 18 having an imager 18a disposed thereat (and may have a flexible electrical connector, such as a flexible ribbon cable or the like, extending therefrom for electrical connection to a processing printed circuit board of the camera). In the illustrated embodiment, the imager PCB 18 is housed or supported at a PCB housing 20 that circumscribes the imager PCB 18 and that has a plurality of apertures or holes 20a established therethrough (such as at the perimeter region of the housing, such as at the corners as shown in FIGS. 2-4).

Figure 5:
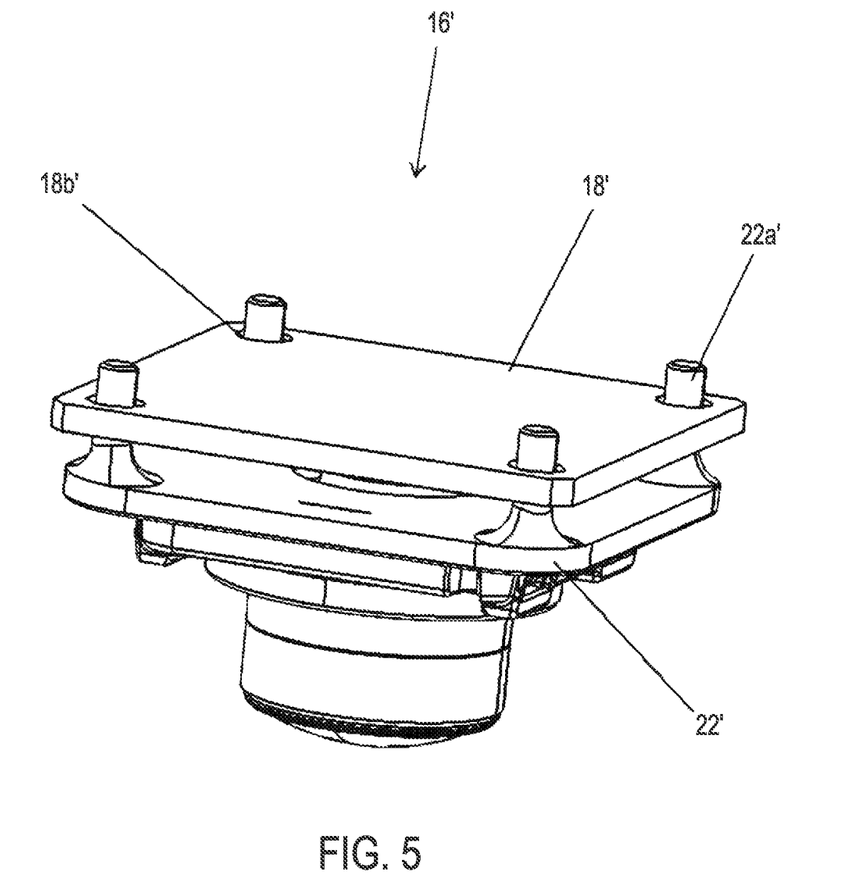
FIG. 5 is a perspective view similar to FIG. 3 of part of another camera.

The imager assembly 16 also includes a lens holder 22 that accommodates or supports a lens barrel 24 that is received therein and that may be secured or fixed thereto, such as via an adhesive or threaded engagement between the lens barrel 24 and the lens holder 22 or the like. The lens barrel 24 accommodates a lens or lens assembly (comprising a plurality of lens optics or elements). The lens holder 22 has a plurality of posts or stakes 22a that protrude from an attaching portion of the lens holder to be received in the plurality of holes or apertures 20a of the PCB housing 20 when the lens holder 22 is positioned at the imager PCB housing 20. Optionally, and such as shown in FIG. 5, the camera or imager assembly 16' may not include a PCB housing, and the imager printed circuit board 18' may have the holes 18b' therethrough for receiving the posts or stakes 22a' of the lens holder 22'.

During manufacture of the imager assembly 16, the lens holder 22 is positioned at the PCB housing 20 so that the posts 22a are received through the holes 20a (see FIG. 3). The holes 20a are sized to have a larger diameter than the outside diameter of the posts 22a, in order to allow for lateral movement and tilting of the posts 22a within the holes 20a (and thus to allow for multi-axis adjustment of the lens relative to the imager during the focus and optical alignment of the lens and imager). The cross dimensions of the posts 22a and the holes 20a are selected to allow for movement of the posts within the holes and across the holes and to allow for twisting or tilting of the posts within the holes, so as to allow for adjustment in multiple degrees of freedom during the focus and alignment of the lens relative to the imager. When the posts 22a are received through the holes 20a (as shown FIG. 3), the lens holder 22 is adjusted relative to the imager 18a to optically align and focus the lens relative to the imager (with the posts moving within the holes of the PCB housing).

When the lens has been properly focused and aligned relative to the imager 18a, heat, such as from a heating device, is applied to the camera assembly 16 to heat and melt or deform the posts 22a at the back side of the imager PCB or PCB housing, whereby the deformed posts cool and harden to secure the lens relative to the imager. Heat may be applied to the camera assembly 16 directly (e.g., a laser or flame) or indirectly (e.g., placing the camera assembly in an oven). For example, the heating device may comprise a laser or a hot air heating device or an induction heating device or flame or the like. Thus, the lens is optically aligned and focused relative to the imager, and the posts 22a are heated to cause the post material (e.g., a thermoplastic material or a soft metal) to melt or deform and then the posts 22a are cooled (such as by deactivating the heating device or removing the camera assembly from the heating device or actively cooling the camera assembly by placing the camera assembly in a cooling chamber or the like) to re-solidify (see FIG. 4), whereby the lens holder 22 is secured to the PCB housing 20 and the imager PCB 18, with the lens optically aligned and focused relative to the imager 18a. Heat may be applied to melt or deform the posts 22a during a heating process that occurs after the lens and imager are focused and aligned or heat may be applied while the lens and imager are focus and aligned so that the posts 22a are malleable as the lens and/or imager are adjusted and then are cooled to re-solidify or harden with the lens and imager focused and aligned.

The posts 22a comprise elongated posts or stakes, such as cylindrical-shaped posts or stakes, and are received through the holes such that a portion of the post 22a extends from either side of the PCB 18 and/or PCB housing 20 to allow for movement of the PCB and/or PCB housing relative to the lens holder 22 in either direction along the posts 22a and to allow for lateral adjustment and/or tilting of the PCB and/or PCB housing relative to the posts. The posts, when heated, deform and expand to fill in gaps between the posts and the PCB and/or PCB housing, and may be expanded beyond the holes 20a at both sides of the PCB to engage both sides of the PCB. The heating device is deactivated and the posts 22a rapidly cool and re-solidify to secure the lens holder 22 to the PCB and/or PCB housing and to not allow movement of the PCB in any direction relative to the lens holder.

Thus, the camera and assembly process actively focuses and aligns the imager plane to the lens image plane, but instead of quick cure adhesive or other components, the image plane is set and secured by non-contact heat staking. The heat may be applied at the posts via lasers, hot air, induction, flame, or other suitable process. The post or stake material may comprise any suitable material that melts or deforms or pools when heated, and then re-solidifies when cooled, such as a thermoplastic or soft metal (e.g., an injection molded plastic lens holder). The camera PCB could potentially be heat staked directly to a plastic lens housing, or the PCB could also have its own housing as shown.

The present invention thus uses a robot to actively focus and align the imager plane to the lens image plane, but instead of using a quick cure adhesive or other components, the image plane is set and secured by non-contact heat staking of the components together. The non-contact heating occurs while the robot is holding the lens barrel and imager in optical alignment and focus. During heating, the post material melts or deforms to fill in the holes and to contact the imager PCB or PCB housing, and then re-solidifies. The assembly process of the present invention eliminates use of an expensive quick cure adhesive, and eliminates expensive UV and secondary curing. The system and process may also decrease assembly tolerances by instantly setting the image plane and the lens plane with non-contact heat staking. The system and process may also provide enhanced or increased thermal transfer, decreased cycle time and a reduction in required capital.

Prior to heat staking the imager PCB is aligned in all six axes to the lens image plane, and then heat is remotely applied to the posts or stakes to melt or deform the material to secure the lens relative to the imager. The process eliminates the need for a UV curing adhesive while still maintaining micron level accuracy in positioning the lens relative to the imager, with no contact being made with the assembly until the posts have been deformed and re-solidified. The robot placement accuracy is maintained through the lack of physical contact with the lens and imager as it is being secured. Optionally, the imager PCB is optically aligned and focused relative to the lens as the heat is applied so that the posts or stakes are malleable as the PCB and lens are adjusted, with the robot maintaining the alignment as the camera assembly cools.

The lens holder may comprise any suitable material that allows for the relative adjustment and quick melting or deforming of the posts at the holes. In other words, the components of the camera assembly, except for the stakes or posts, are configured to maintain their shape and functionality when the heat is applied. For example, the lens holder may comprise a plastic or polymeric material. The camera may utilize aspects of the cameras described in U.S. patent application Ser. No. 17/303,784, filed Jun. 8, 2021, which published on Dec. 9, 2021 as U.S. Patent Publication No. US-2021-0382375, which is hereby incorporated herein by reference in its entirety.

In the illustrated embodiments, the imager assembly is part of a camera, where the imager assembly may be disposed at a housing portion and the flexible connector may be electrically connected to another circuit board of the camera (such as a processor circuit board having an image processor and other circuitry disposed thereat), such as by utilizing aspects of the windshield-mounted camera assemblies described in U.S. Pat. Nos. 9,896,039; 9,871,971 and/or 9,596,387, which are all hereby incorporated herein by reference in their entireties. Optionally, the imager assembly may be part of an exterior-mounted camera, where a rear housing may be mated with the lens holder after the imager printed circuit board is attached to the lens holder, such as by utilizing aspects of the windshield-mounted camera assemblies described in U.S. Pat. Nos. 10,272,857 and/or 10,264,219, which are hereby incorporated herein by reference in their entireties. The camera assembly includes an electrical connector portion that is configured to electrically connect to a vehicle wire harness when the camera is installed at a vehicle.

Although shown as having a single printed circuit board (having the imager at one side and circuitry and connecting elements (such as a header connector) at the other side), the camera assembly may include an imager printed circuit board and a separate connector printed circuit board, with the circuitry of the two printed circuit boards electrically connected. The printed circuit boards may be attached at the lens holder or to the rear camera housing, and/or may be attached to one another, such as by utilizing aspects of the cameras and processes described in U.S. Publication No. US-2020-0010024, which is hereby incorporated herein by reference in its entirety. The imager is aligned with the lens at the lens holder and the lens is optically aligned and focused with the imager and the housing portions are joined or bonded, such as by utilizing aspects of the cameras and processes described in U.S. Pat. Nos. 10,272,857; 10,264,219; 9,451,138; 9,277,104 and/or 8,542,451, which are hereby incorporated herein by reference in their entireties.

The camera may include electrical connecting elements that accommodate tolerances in the housing and/or PCB mounting and/or connector portion. The electrical connecting elements may utilize aspects of the cameras and electrical connectors described in U.S. Pat. No. 9,233,641 and/or U.S. Publication Nos. US-2013-0242099; US-2014-0373345; US-2015-0222795; US-2015-0266430; US-2015-0365569; US-2016-0037028; US-2016-0268716; US-2017-0133811; US-2017-0295306 and/or US-2017-0302829, which are hereby incorporated herein by reference in their entireties. Optionally, the electrical connections may be established via molded interconnect device (MID) technology, such as by utilizing aspects of the cameras described in U.S. Publication Nos. US-2018-0072239; US-2017-0295306 and/or US-2016-0037028, which are hereby incorporated herein by reference in their entireties.

The system includes an image processor operable to process image data captured by the camera or cameras, such as for detecting objects or other vehicles or pedestrians or the like in the field of view of one or more of the cameras. For example, the image processor may comprise an image processing chip selected from the EYEQ family of image processing chips available from Mobileye Vision Technologies Ltd. of Jerusalem, Israel, and may include object detection software (such as the types described in U.S. Pat. Nos. 7,855,755; 7,720,580 and/or 7,038,577, which are hereby incorporated herein by reference in their entireties), and may analyze image data to detect vehicles and/or other objects. Responsive to such image processing, and when an object or other vehicle is detected, the system may generate an alert to the driver of the vehicle and/or may generate an overlay at the displayed image to highlight or enhance display of the detected object or vehicle, in order to enhance the driver's awareness of the detected object or vehicle or hazardous condition during a driving maneuver of the equipped vehicle.

Optionally, the camera may comprise a forward viewing camera, such as disposed at a windshield electronics module (WEM) or the like. The forward viewing camera may utilize aspects of the systems described in U.S. Pat. Nos. 9,896,039;

9,871,971; 9,596,387; 9,487,159; 8,256,821; 7,480,149; 6,824,281 and/or 6,690,268, which are all hereby incorporated herein by reference in their entireties.

Changes and modifications in the specifically described embodiments can be carried out without departing from the principles of the invention, which is intended to be limited only by the scope of the appended claims, as interpreted according to the principles of patent law including the doctrine of equivalents.

The invention claimed is:

1. A vehicular camera, the vehicular camera comprising:
a lens holder accommodating a lens;
wherein the lens holder comprises a plurality of posts protruding from an attaching portion of the lens holder;
an imager printed circuit board (imager PCB), wherein the imager PCB comprises a first side and a second side opposite the first side and separated from the first side by a thickness of the imager PCB, and wherein an imager is disposed at the first side of the imager PCB, and wherein the imager PCB comprises a plurality of apertures therethrough;
wherein the attaching portion of the lens holder is positioned at the imager PCB such that said posts protrude through the apertures of the imager PCB;
wherein the posts are movable within the apertures while the lens is adjusted relative to the imager to align the lens relative to the imager; and
wherein, with the lens aligned relative to the imager, the posts are heated to deform within the apertures, whereby the deformed posts harden upon cooling to secure the lens holder relative to the imager PCB.

2. The vehicular camera of claim 1, wherein the posts are laser heated to deform within the apertures to secure the lens holder relative to the imager PCB.

3. The vehicular camera of claim 1, wherein the imager PCB comprises a housing portion that circumscribes a circuit board portion, and wherein the imager is disposed at the circuit board portion, and wherein the apertures are established through the housing portion.

4. The vehicular camera of claim 1, wherein the lens holder comprises a plastic injection molded lens holder.

5. The vehicular camera of claim 1, wherein the posts comprise a thermoplastic material.

6. The vehicular camera of claim 1, wherein a rear housing is mated with the lens holder after the imager PCB is attached to the lens holder.

7. The vehicular camera of claim 1, comprising an electrical connector portion configured to electrically connect to a wire harness of a vehicle equipped with the vehicular camera.

8. The vehicular camera of claim 1, wherein the apertures are disposed at respective corner regions of the imager PCB.

9. The vehicular camera of claim 1, wherein the posts are heated after the lens is aligned relative to the imager.

10. The vehicular camera of claim 1, wherein the posts are heated as the lens is aligned relative to the imager.

11. A method for assembling a vehicular camera, the method comprising:
providing a lens holder accommodating a lens, wherein the lens holder comprises a plurality of posts protruding from an attaching portion of the lens holder;
providing an imager printed circuit board (imager PCB), wherein the imager PCB comprises a first side and a second side opposite the first side and separated from the first side by a thickness of the imager PCB, and wherein an imager is disposed at the first side of the imager PCB, and wherein the imager PCB comprises a plurality of apertures therethrough;
positioning the attaching portion of the lens holder at the imager PCB such that the posts protrude through the apertures of the imager PCB;
moving the posts within the apertures while adjusting the lens relative to the imager to align the lens relative to the imager; and
with the lens aligned relative to the imager, heating the posts to deform the posts within the apertures, whereby the deformed posts harden upon cooling to secure the lens holder relative to the imager PCB.

12. The method of claim 11, wherein heating the posts comprises using a laser.

13. The method of claim 11, wherein the imager PCB comprises a housing portion that circumscribes a circuit board portion, and wherein the imager is disposed at the circuit board portion, and wherein the apertures are established through the housing portion.

14. The method of claim 11, wherein the lens holder comprises a plastic injection molded lens holder.

15. The method of claim 11, wherein the posts comprise a thermoplastic material.

16. The method of claim 11, wherein the apertures are disposed at respective corner regions of the imager PCB.

17. The method of claim 11, wherein the posts are heated after the lens is aligned relative to the imager.

18. The method of claim 11, wherein the posts are heated as the lens is aligned relative to the imager.

19. A vehicular camera, the vehicular camera comprising:
a lens holder accommodating a lens;
wherein the lens holder comprises a plurality of posts protruding from an attaching portion of the lens holder;
an imager printed circuit board (imager PCB), wherein the imager PCB comprises a first side and a second side opposite the first side and separated from the first side by a thickness of the imager PCB, and wherein an imager is disposed at the first side of the imager PCB;
wherein the imager PCB comprises a housing portion that circumscribes a circuit board portion, and wherein the imager is disposed at the circuit board portion, and wherein the imager PCB comprises a plurality of apertures established through the housing portion at respective corner regions of the imager PCB;
wherein the attaching portion of the lens holder is positioned at the imager PCB such that said posts protrude through the apertures of the imager PCB;
wherein the posts are movable within the apertures while the lens is adjusted relative to the imager to align the lens relative to the imager;
wherein, with the lens aligned relative to the imager, the posts are heated to deform within the apertures, whereby the deformed posts harden upon cooling to secure the lens holder relative to the imager PCB; and
a rear housing that is mated with the lens holder after the imager PCB is attached to the lens holder.

20. The vehicular camera of claim 19, wherein the posts are laser heated to deform within the apertures to secure the lens holder relative to the imager PCB.

21. The vehicular camera of claim 19, wherein the lens holder comprises a plastic injection molded lens holder.

22. The vehicular camera of claim 19, wherein the posts comprise a thermoplastic material.

23. The vehicular camera of claim 19, wherein the posts are heated after the lens is aligned relative to the imager.

24. The vehicular camera of claim 19, wherein the posts are heated as the lens is aligned relative to the imager.

\* \* \* \* \*